(12) United States Patent
Gilling et al.

(10) Patent No.: US 8,212,517 B2
(45) Date of Patent: Jul. 3, 2012

(54) BATTERY TYPE SENSING METHOD AND DEVICE FOR SENSING BATTERY TYPE

(75) Inventors: Erik Gilling, Oakland, CA (US); John Wilson, San Francisco, CA (US); Robert Kelley, Portland, OR (US)

(73) Assignee: Google Inc., Mountain View, CA (US)

( * ) Notice: Subject to any disclaimer, the term of this patent is extended or adjusted under 35 U.S.C. 154(b) by 663 days.

(21) Appl. No.: 11/970,415

(22) Filed: Jan. 7, 2008

(65) Prior Publication Data
US 2009/0174370 A1 Jul. 9, 2009

(51) Int. Cl.
*H02J 7/00* (2006.01)
(52) U.S. Cl. ....................................................... 320/106
(58) Field of Classification Search .................. 320/106
See application file for complete search history.

(56) References Cited

U.S. PATENT DOCUMENTS

| | | | | |
|---|---|---|---|---|
| 5,592,069 A | * | 1/1997 | Dias et al. | 320/106 |
| 5,698,983 A | * | 12/1997 | Arai et al. | 324/427 |
| 5,867,006 A | | 2/1999 | Dias et al. | |
| 6,108,751 A | | 8/2000 | Lee et al. | |
| 6,879,517 B2 | | 4/2005 | Geren et al. | |
| 6,969,970 B2 | | 11/2005 | Dias et al. | |
| 7,367,227 B2 | * | 5/2008 | Stewart et al. | 73/146 |
| 7,747,878 B2 | * | 6/2010 | Vyssotski et al. | 713/300 |
| 2005/0052188 A1 | * | 3/2005 | Toya | 324/527 |
| 2007/0194751 A1 | * | 8/2007 | Odaohhara | 320/112 |

OTHER PUBLICATIONS

"Overview of 1-Wire Technology and Its Use", Copyright 2005 by Maxim Integrated Products, 6 pages; http://www.maxim-ic.com/appnotes.cfm/appnote_number/1796.
"DS2438 Smart Battery Monitor", Copyright 2005 by Maxim Integrated Products, 2 pages; http://www.maxim-ic.com/quick-view2.cfm/qv_pk/2919.

\* cited by examiner

*Primary Examiner* — Arun Williams
(74) *Attorney, Agent, or Firm* — Morris & Kamlay LLP (57) ABSTRACT

A battery type detection approach is disclosed. In one embodiment, a method of detecting a battery type can include: receiving a signal from a battery module in a portable computing device; determining if the signal is in a first state for at least a first predetermined time before transitioning to a second state; determining if the signal transitions from the second state to the first state after a second predetermined time, and identifying the battery type in response thereto; and asserting an indication of the battery type when a third predetermined time period after the transition from the second state to the first state has occurred.

24 Claims, 6 Drawing Sheets

BATTERY TYPE SENSING METHOD AND DEVICE FOR SENSING BATTERY TYPE

FIELD OF THE INVENTION

The invention relates in general to providing power to electronic devices, and more specifically to power supply detection and management based on power source type detection.

BACKGROUND

Increasing use of portable computing or electronic devices has led to increased reliance on battery power. Devices such as cell phones, personal digital assistants (PDAs), small computers, e-mail devices, audio players, video players, etc., are often designed to use different types of batteries. For example, a user may choose to purchase a standard-charge battery or a double-capacity battery for use with a single device. Typically, a charging system is provided so that the batteries can be re-charged from wall outlets that connect to the urban power grid. In many cases, a single charging system is designed to charge different types of batteries.

It is often important to detect the type of battery being charged or used. During charging, the capacity and charge characteristics of a battery must be complied with by the charging system in order to properly charge the battery. During use, the device using the battery for power may adjust its performance or other characteristics depending upon the type of battery.

SUMMARY

A battery detection approach in accordance with embodiments of the present invention can be utilized to implement a power management regime suitable for each type of battery. Further, a single wire interface between a battery subsystem or module and an embedded controller in a portable computing device can be used to determine the battery type. In addition, other safeguards can be implemented for cases where an unapproved battery type has been attached to the portable computing device.

In one embodiment, a method of detecting a battery type can include: receiving a signal from a battery module in a portable computing device; determining if the signal is in a first state for at least a first predetermined time before transitioning to a second state; determining if the signal transitions from the second state to the first state after a second predetermined time, and identifying the battery type in response thereto; and asserting an indication of the battery type when a third predetermined time period after the transition from the second state to the first state has occurred.

In one embodiment, a method of controlling a battery module in a portable computing device can include: determining a battery type using a signal received from the battery module; allowing charging of the battery module at a first rate when a first battery type has been detected; allowing charging of the battery module at a second rate when a second battery type has been detected; and adjusting access to the battery module when neither the first nor the second battery types have been detected.

In one embodiment, a portable computing device can include: one or more processors; and logic encoded in one or more tangible media for execution by the one or more processors, and when executed operable to: receive a signal from a battery module; determine if the signal is in a first state for at least a first predetermined time before transitioning to a second state; determine if the signal transitions from the second state to the first state after a second predetermined time, and identify a battery type in response thereto; and assert an indication of the battery type when a third predetermined time period after the transition from the second state to the first state has occurred.

DETAILED DESCRIPTION

Electronic devices and batteries typically interface or provide information flow, such as: alarm flags, over/under-voltage notifications, over/under-current notifications, average current flow, instantaneous current flow, estimates of total charge left in the battery, numerical integration of current flow measurements, cycle times, total cycles expended, temperature measurements, fuel gauges, safety circuit status, as well as charge/discharge device status, for example.

Figure 1:
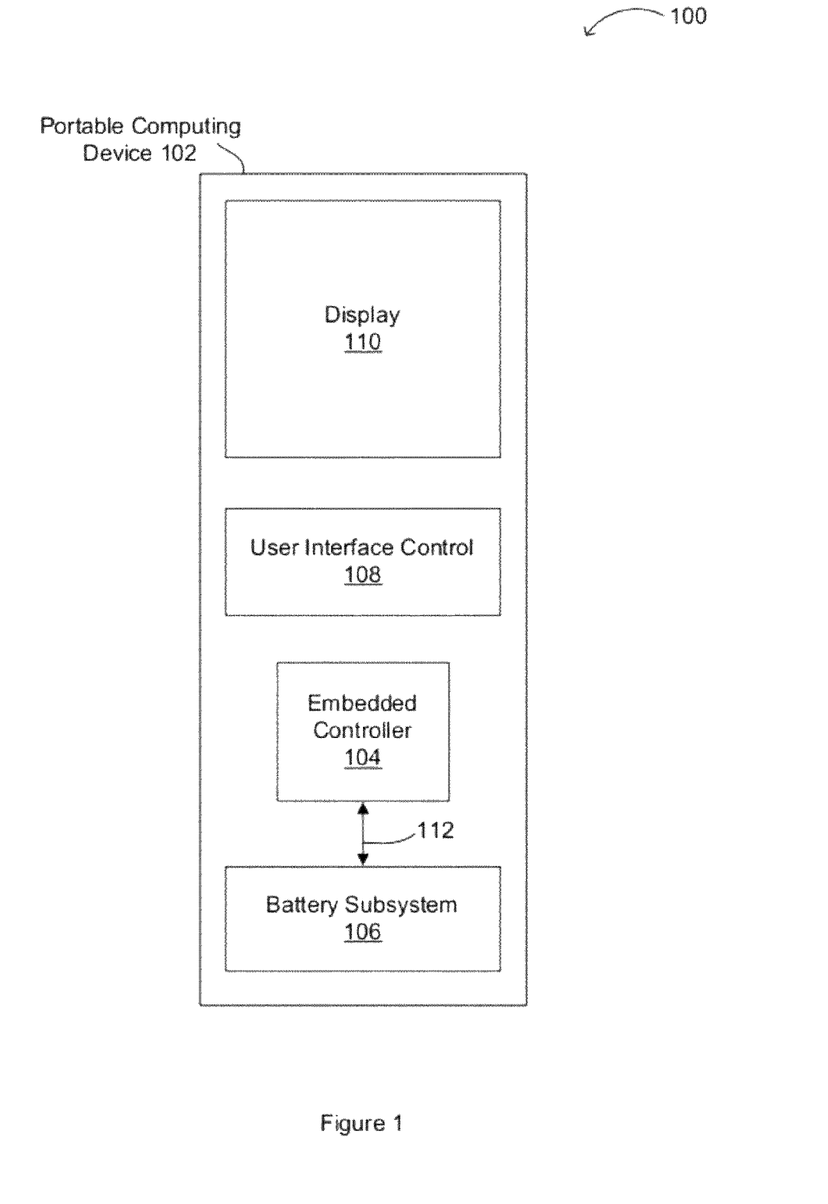
FIG. 1 illustrates an example portable computing device arrangement in accordance with embodiments of the present invention.

Referring now to FIG. 1, an example portable computing device arrangement in accordance with embodiments of the present invention is indicated by the general reference character 100. Portable computing device 102 can include embedded controller 104, battery subsystem 106, user interface control 108, and display 110, for example. Although battery subsystem 106 is described primarily with respect to batteries, it can include any other suitable type of energy-providing mechanisms, such as capacitors and/or any suitable combination of capacitors and batteries. Also, some features described herein may be adaptable to any other type of power source, such as where an external battery is used (e.g., a device obtaining power from a vehicle's battery), or where a standard line power is used (e.g., alternating current residential or business infrastructure power). Further, battery subsystems or modules can include or be associated with unique identifiers (IDs), or nonvolatile storage elements (e.g., electrically erasable programmable read-only memory (EEPROM)) to save power management preferences.

In particular embodiments, a single wire interface 112 can be utilized between embedded controller 104 and battery subsystem 106 in order to determine a battery type. In this fashion, a battery can communicate with portable computing device 102 via embedded controller 104. Further, communication can occur within battery subsystem 106 (e.g., between components or chips therein to regulate power consumption, charging, report on status, etc.). For example, one wire interface 112 can be utilized to determine if battery subsystem 106 contains a single capacity type battery, or a double capacity type battery. Of course, other battery types and/or interfaces can also be accommodated in particular embodiments.

Figure 2:
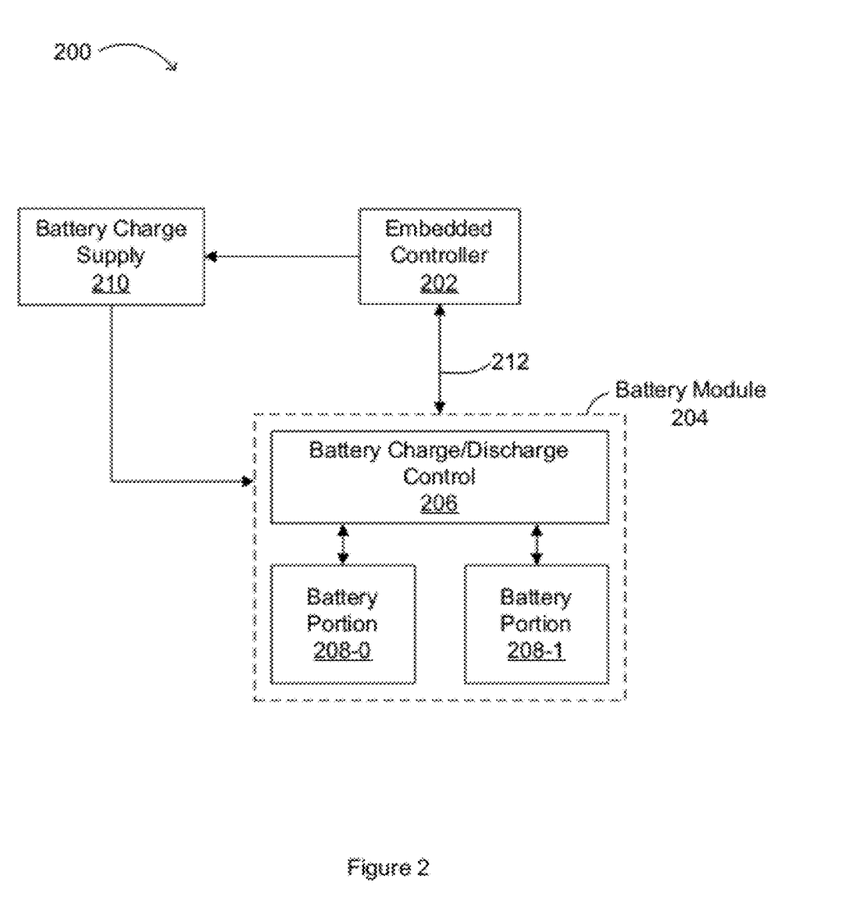
FIG. 2 shows an example battery module structure in accordance with embodiments of the present invention.

Referring now to FIG. 2, an example battery module structure in accordance with embodiments of the present invention is shown and indicated by the general reference character 200. Embedded controller 202 can interface with battery module 204 via one wire interface 212. Battery module 204 can include battery charge/discharge control 206, as well as battery portions 208-0 and 208-1. In particular embodiments, detections as to whether both battery portions are filled, or other suitable battery arrangements, can be found using embedded controller 202 via interface 212, and then utilized to control battery charge supply 210. Battery charge supply 210 can include a plug for AC power coupled to a DC adapter, or any other suitable approach for providing charge to battery module 204.

For example, two different types of batteries may be accommodated in a particular portable computing device, and one may be charged at twice (e.g., a double capacity battery type) the charge rate as the other (e.g., a single capacity battery type). In one example, two single battery portions (e.g., 208-0 and 208-1) can be arranged in parallel, such that twice the current can be applied or allowed for charging (e.g., via a battery charge supply 210) when both battery portions are occupied (e.g., detected as a certain battery type), as opposed to only one such portion being occupied (e.g., detected as a different battery type).

Figure 3:
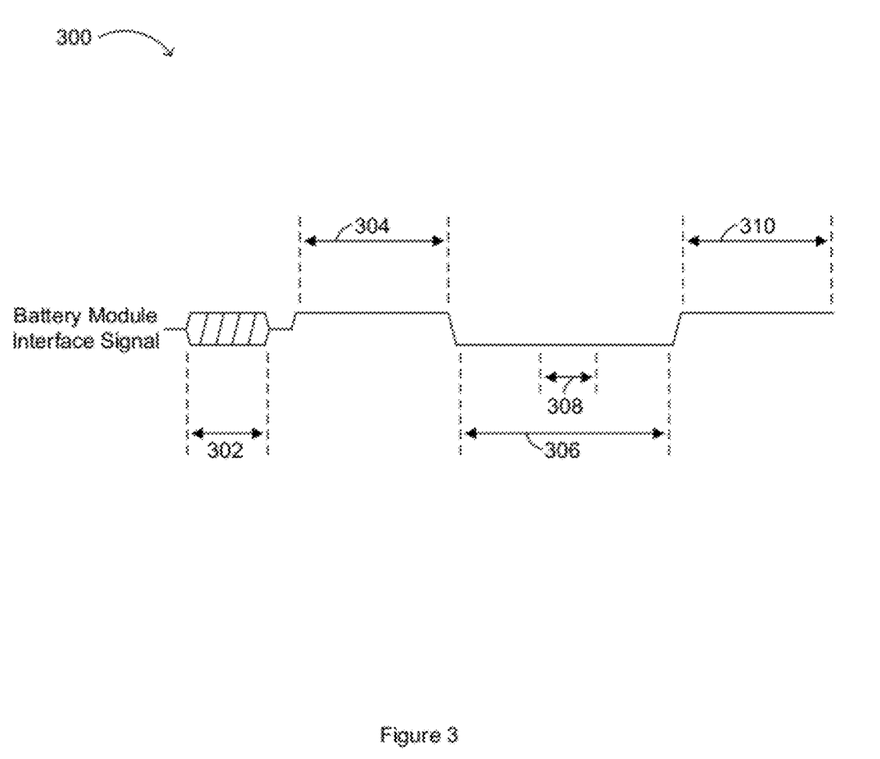
FIG. 3 shows an example waveform for battery type detection in accordance with embodiments of the present invention.

Referring now to FIG. 3, an example waveform for battery type detection in accordance with embodiments of the present invention is shown and indicated by the general reference character 300. For example, the battery module interface signal can be one wire interface 212, as shown above in FIG. 2. In FIG. 3, signal portion 302 may represent communication substantially within or related to the battery subsystem (e.g., may not be related to a battery type detection protocol), and may be characterized by multiple signal transitions (e.g., logic high/low level transitions).

Signal portion 304 may indicate that this "battery talk" (e.g., signal portion 302) is ending, such that the bus or one wire interface can be utilized by the embedded controller. For example, signal portion 304 may be characterized by maintaining a high level for at least 1 ms. Of course, any other suitable predetermined time period (e.g., from about 0.75 ms to about 1.25 ms, or about 0.5 ms to about 1.5 ms) or voltage level (e.g., low instead of high, or some intermediate level) on the one wire interface can also be used in particular embodiments.

Next, signal portion 306 including a low level portion, can be sampled a predetermined time (e.g., during sampling window 308) after the high to low transition (e.g., bordering signal portions 304 and 306). For example, the predetermined time for sampling may be within about 1.5 ms to about 2.5 ms. Of course, any other suitable predetermined time period (e.g., from about 1.25 ms to about 2.75 ms, or about 1.0 ms to about 3.0 ms) on the one wire interface can also be used in particular embodiments. In particular embodiments, if the signal has remained low for at least 1 ms (or some other suitable time period prior to entering the sampling window), sampling window 308 may be utilized to determine when the signal goes high to identify the battery as a first (e.g., single capacity) or a second (e.g., double capacity) type. Such a battery type indication may be asserted by the embedded controller after another time period (e.g., portion 310) when the signal is in a high level. For example, portion 310 may extend for at least 64 ms, or any other suitable predetermined time (e.g., from about 50 ms to about 80 ms).

Further, if a user of the portable computing device disconnects the battery and the one wire interface goes low for some extended interval, then the protocol detection program can be reset by the embedded controller. Also, the battery module may communicate within itself periodically, such as shown in signal portion 302. For example, the battery module may interrogate itself (e.g., a heartbeat test) periodically (e.g., every 6 seconds) to ensure appropriate connections, battery charge levels, or the like. In particular embodiments, the battery module may also provide indications conforming to a predetermined protocol as described herein to the embedded controller for battery type determination.

Figure 4:
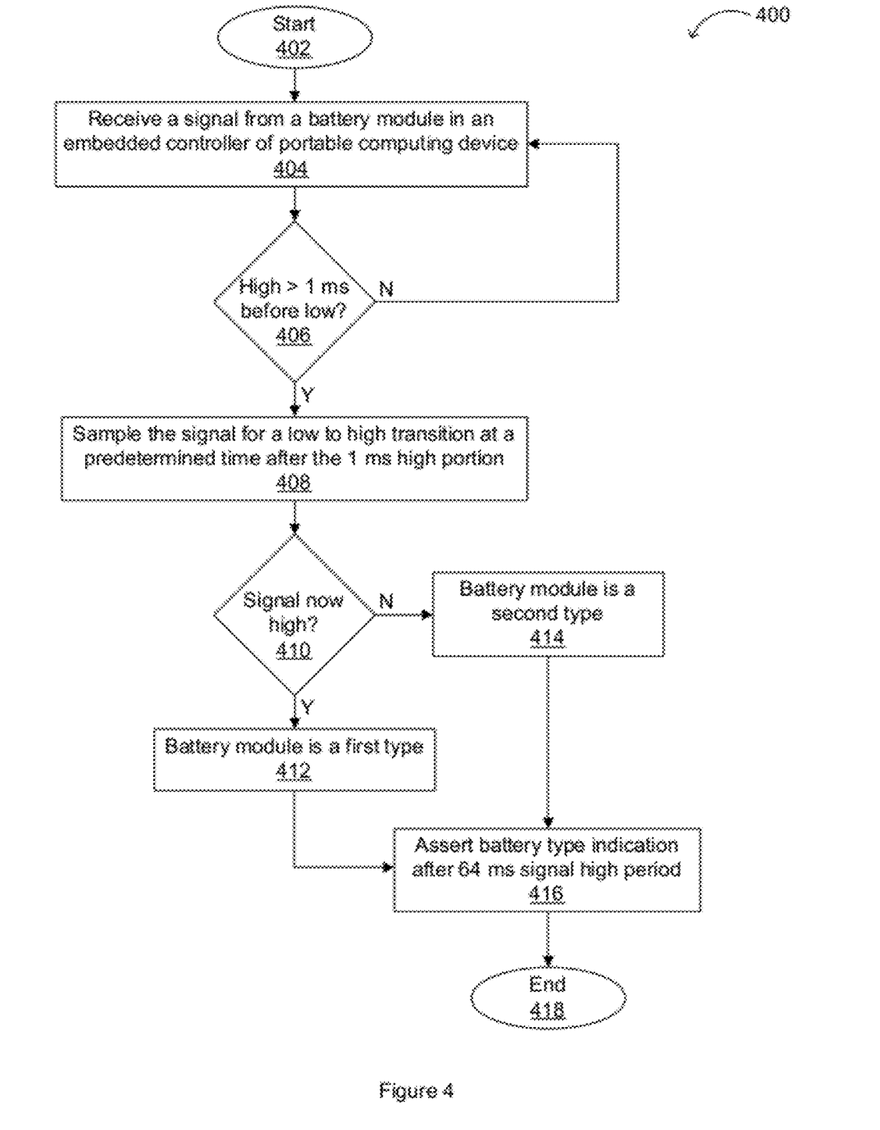
FIG. 4 shows a flow diagram of a first example method of detecting a battery type in accordance with embodiments of the present invention.

Referring now to FIG. 4, a flow diagram of a first example method of detecting a battery type in accordance with embodiments of the present invention is shown and indicated by the general reference character 400. A second example battery type detection method will be discussed below with reference to FIG. 6. In FIG. 4, the flow can begin (402), and a signal may be received from a battery module, and may be received in an embedded controller of a portable computing device (404). If the signal is high for at least 1 ms before going low (406), the signal may be sampled for a low to high transition at a predetermined time (e.g., from about 1.5 to about 2.5 ms) after the high to low signal transition (408). If the signal is not detected as high for at least 1 ms (406), the signal can be monitored (404), and may be within a battery talk signal portion (e.g., 302 of FIG. 3), or some other portion.

Once the signal has been sampled for a low to high transition (408), if the signal is now high at the sample point (410), the battery module may be designated as a first type (412). Alternatively, if the signal is not yet high at the sample point (410), the battery module may be designated as a second type (414). If either the first or the second battery type is so detected, a battery type indication may then be asserted if the signal remains high for at least 64 ms (416), and the flow can complete (418). In this fashion, a battery type can be detected using a single wire interface, where the battery module may drive the signal conforming to a particular predetermined protocol.

In addition, while particular predetermined time periods, sampling windows, and voltage levels (e.g., logic high or low levels) are described herein with respect to particular examples, any suitable approaches may also be used. For example, small-swing voltages, differential signaling, and/or current-based control can also be used for battery type determination using an interface between the battery module and the embedded controller. Further, timing aspects, such as predetermined time periods and sampling windows, may be varied in particular embodiments.

Figure 5:
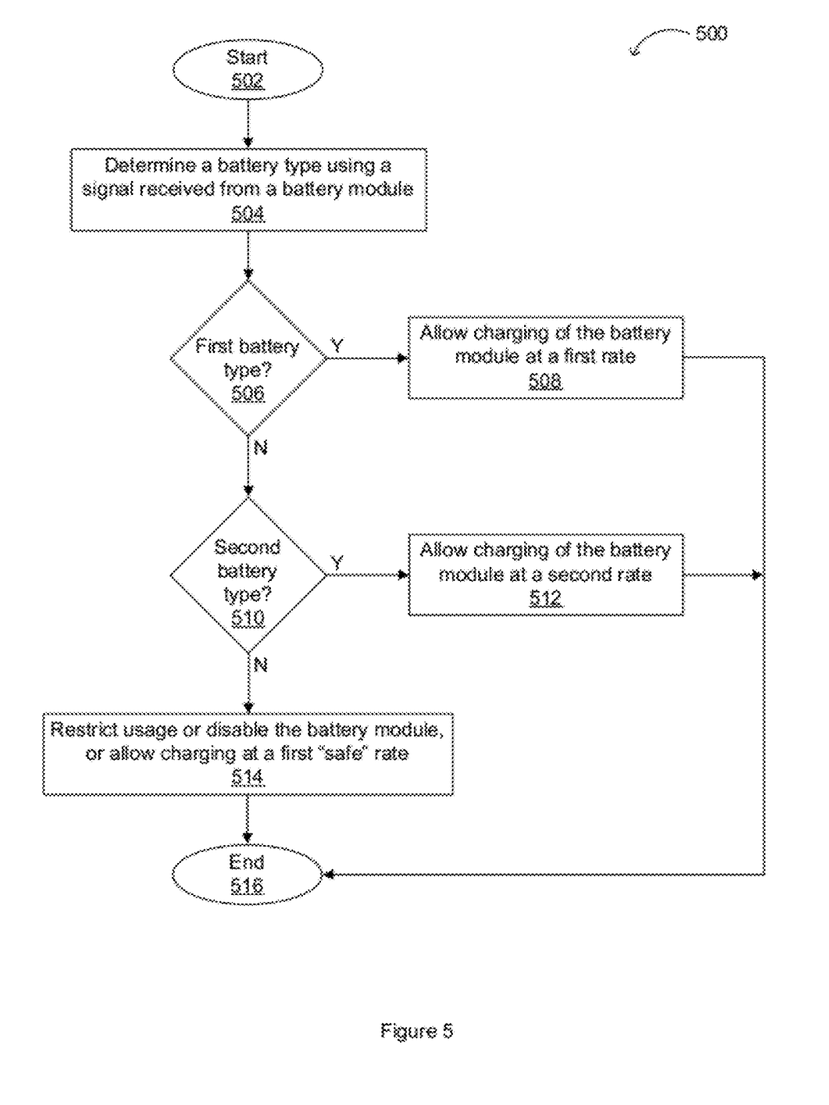
FIG. 5 illustrates a flow diagram of an example method of controlling a battery module based on battery type in accordance with embodiments of the present invention.

Referring now to FIG. 5, a flow diagram of an example method of controlling a battery module based on battery type in accordance with embodiments of the present invention is shown and indicated by the general reference character 500. The flow can begin (502), and a battery type may be determined using a signal received from a battery module (504). For example, this determination can be made using the flow as shown above in FIG. 4. In FIG. 5, if the first battery type has been detected (506), charging of the battery module may be allowed at a first rate (508), and the flow can complete (516).

If the first battery type has not been detected (506), but the second battery type has been detected (510), charging of the battery module may be allowed at a second rate (512), and the flow can complete (516). However, if neither the first type (506), or the second type (510) of battery is detected, usage or battery module access may be restricted, or charging may simply be allowed at a first "safe" rate (514), thus completing the flow (516). For example, such usage restriction can prevent unauthorized third-party battery add-ons, and in such a case, the battery may not effectively work with the portable computing device. Other options include suppressing certain functions, reducing device speed, increasing a discharge rate of the battery, etc., for such unauthorized batteries that are detected. For the option of allowing charging at a first safe rate (514), the battery module can be treated as if the first battery type was in fact detected.

Figure 6:
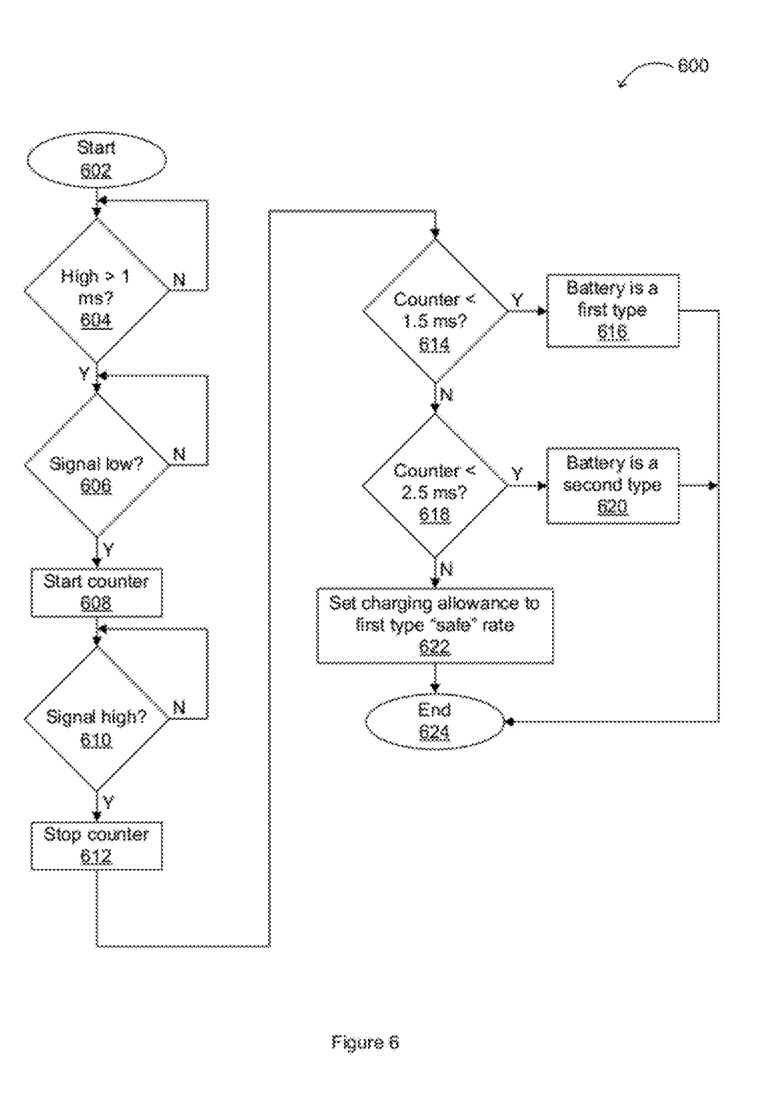
FIG. 6 illustrates a flow diagram of a second example method of detecting a battery type in accordance with embodiments of the present invention.

Referring now to FIG. 6, a flow diagram of a second example method of detecting a battery type in accordance with embodiments of the present invention is shown and indicated by the general reference character 600. The flow can begin (602), and once the signal is detected high for at least 1 ms (604), the signal can be tested to determine if it is now low (606). Once the signal is sampled as low (606), a counter can be started (608). Such a counter can be used to determine how long the signal remains low before transitioning high. As discussed above, this low portion range can typically be from about 1.5 ms to about 2.5 ms in one example. The counter can continue counting until the signal transitions high (610), thus stopping the counter (612).

At this point, the low portion time range can be ascertained from the counter result. If the counter result is less than about 1.5 ms (614), the battery can be characterized as a first type (616), and the flow can complete (624). However, if the counter is greater than 1.5 ms (614), but less than about 2.5 ms (618), the battery can be characterized as a second type (620), and the flow can complete (624). If neither the first nor the second type is explicitly determined, the battery module charging allowance can be set at a first type safe rate (622), thus completing the flow (624). Of course, while only two battery type determinations have been shown in this particular example, any number of battery types can be accommodated in specific embodiments. For example, counter results indicating ranges from about 2.5 ms to about 3.5 ms, and from about 3.5 ms to about 4.5 ms, and so on, can be utilized to determine any number of battery module types in specific embodiments.

Although particular embodiments of the invention have been described, variations of such embodiments are possible and are within the scope of the invention. For example, although specific battery types and protocols have been described, other types of batteries, numbers of allowable battery types, and/or protocols, can be accommodated in accordance with embodiments of the present invention. Also, applications other than portable computing devices or the like can also be accommodated in accordance with particular embodiments. Embodiments of the invention can operate among any one or more processes or entities including users, devices, functional systems, and/or combinations of hardware and software.

Any suitable programming language can be used to implement the functionality of the present invention including C, C++, Java, assembly language, etc. Different programming techniques can be employed such as procedural or object oriented. The routines can execute on a single processing device or multiple processors. Although the steps, operations or computations may be presented in a specific order, this order may be changed in different embodiments unless otherwise specified. In some embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing. The functions may be performed in hardware, software or a combination of both.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer-readable medium" for purposes of embodiments of the present invention may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. Functions and parts of functions described herein can be achieved by devices in different places and operating at different times. For example, a processor can perform its functions in "real time," "offline," in a "batch mode," etc. Parallel, distributed or other processing approaches can be used.

Reference throughout this specification to "one embodiment", "an embodiment", "a particular embodiment," or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. For example, distributed, networked systems, components and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

Thus, the scope of the invention is to be determined solely by the appended claims.

In the claims:

1. A method of detecting a battery type, comprising:
   receiving a signal of a waveform that has high and low logic levels and transitions between the high and low logic levels from a battery module in a portable computing device;
   determining if the signal is in a first state which is one of the high and low logic levels for at least a first predetermined time before transitioning to a second state which is the other of the high and low logic levels;
   determining if the signal transitions from the second state to the first state after a second predetermined time, and identifying the battery type in response thereto; and
   asserting an indication of the battery type when a third predetermined time period after the transition from the second state to the first state has occurred.

2. The method of claim 1, wherein the receiving the signal comprises using a one wire interface between the battery module and an embedded controller.

3. The method of claim 1, wherein the first state comprises a logic high level.

4. The method of claim 1, wherein the second state comprises a logic low level.

5. The method of claim 1, wherein the first predetermined time comprises about 1 ms.

6. The method of claim 1, wherein the second predetermined time comprises from about 1.5 ms to about 2.5 ms.

7. The method of claim 1, wherein the third predetermined time comprises about 64 ms.

8. The method of claim 1, wherein the identifying the battery type in response to the signal transition determination comprises identifying a first battery type if the signal has transitioned prior to a sampling at the second predetermined time.

9. The method of claim 1, wherein the identifying the battery type in response to the signal transition determination comprises identifying a second battery type if the signal has not yet transitioned prior to a sampling at the second predetermined time.

10. The method of claim 1, wherein the asserting the indication of the battery type comprises controlling an allowable charge rate of the battery module.

11. A method of controlling a battery module in a portable computing device, the method comprising:
    receiving a signal from the battery module of a waveform that has high and low logic levels and transitions between the high and low logic levels from a battery module in a portable computing device;
    determining if the signal is in a first state which is one of the high and low logic levels for at least a first predetermined time before transitioning to a second state which is the other of the high and low logic levels;
    determining if the signal transitions from the second state to the first state after a second predetermined time, and identifying the battery type in response thereto;
    determining a battery type using a signal received from the battery module;
    allowing charging of the battery module at a first rate when a first battery type has been detected;
    allowing charging of the battery module at a second rate when a second battery type has been detected; and
    adjusting access to the battery module when neither the first nor the second battery types have been detected.

12. The method of claim 11, wherein the determining the battery type comprises sampling a state of the signal at predetermined times.

13. The method of claim 11, wherein the first rate is about half the second rate.

14. The method of claim 11, wherein the allowing charging of the battery module at the first rate comprises disabling a portion of a charge path to the battery module.

15. The method of claim 11, wherein the allowing charging of the battery module at the second rate comprises enabling a full charge path to the battery module.

16. The method of claim 11, wherein the adjusting access to the battery module comprises substantially reducing charge available to be drawn from the battery module.

17. The method of claim 11, wherein the adjusting access to the battery module comprises disabling access to charge from the battery module.

18. A portable computing device, comprising:
    one or more processors; and
    logic encoded in one or more non-transitory tangible media for execution by the one or more processors, and when executed operable to:
        receive a signal of a waveform that has high and low logic levels and transitions between the high and low logic levels from a battery module;

determine if the signal is in a first state which is one of the high and low logic levels for at least a first predetermined time before transitioning to a second state which is the other of the high and low logic levels;

determine if the signal transitions from the second state to the first state after a second predetermined time, and identify a battery type in response thereto; and assert an indication of the battery type when a third predetermined time period after the transition from the second state to the first state has occurred.

19. The portable computing device of claim 18, wherein the one or more processors comprise an embedded controller.

20. The portable computing device of claim 19, wherein the signal is received using a one wire interface between the battery module and the embedded controller.

21. The method of claim 1, wherein the step of identifying the battery type further comprises determining a number of battery portions that are occupied in a battery module.

22. The method of claim 1, further comprising:
in response to the asserted indication of the battery type, beginning charging of the battery module in the portable device according to the indicated battery type.

23. The portable computing device of claim 19, further comprising logic encoded in one or more non-transitory tangible media for execution by the one or more processors, and when executed operable to:
begin charging the battery module in the portable device in response to the asserted indication of the battery type.

24. A method, comprising:
prior to allowing a battery to be charged, receiving a signal of a waveform that has high and low logic levels and transitions between the high and low logic levels from a battery module in a portable computing device;

determining if the signal is in a first state which is one of the high and low logic levels for at least a first predetermined time before transitioning to a second state which is the other of the high and low logic levels;

determining if the signal transitions from the second state to the first state after a second predetermined time, and identifying the battery type in response thereto; and asserting an indication of the battery type when a third predetermined time period after the transition from the second state to the first state has occurred.

* * * * *